(12) United States Patent
Barringer et al.

(10) Patent No.: US 12,648,075 B2
(45) Date of Patent: Jun. 2, 2026

(54) COMPUTER HARDWARE INSTALLATION AND REMOVAL TOOL

(71) Applicant: INTERNATIONAL BUSINESS MACHINES CORPORATION, Armonk, NY (US)

(72) Inventors: Wayne A. Barringer, Wallkill, NY (US); Eric James McKeever, Pleasant Valley, NY (US); David P. Graybill, Staatsburg, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 18/491,015

(22) Filed: Oct. 20, 2023

(65) Prior Publication Data

US 2025/0133648 A1 Apr. 24, 2025

(51) Int. Cl.
H05K 1/02 (2006.01)

(52) U.S. Cl.
CPC ..... H05K 1/02 (2013.01); H05K 2201/09063 (2013.01)

(58) Field of Classification Search
CPC .......... H05K 1/02; H05K 2201/09063; H05K 7/1415; H05K 13/0491; H05K 7/1402; H05K 7/1422; H05K 7/1461; H05K 7/147; G06F 1/186
See application file for complete search history.

(56) References Cited

U.S. PATENT DOCUMENTS

| | | | | |
|---|---|---|---|---|
| T876,004 | I4 | 7/1970 | Andreini et al. | |
| 3,896,535 | A * | 7/1975 | Tucci | H01R 43/22 |
| | | | | 29/762 |
| 4,223,934 | A * | 9/1980 | Cauceglia | H05K 7/1415 |
| | | | | 294/34 |
| 4,233,646 | A * | 11/1980 | Leung | H05K 7/1409 |
| | | | | 361/752 |
| 4,313,150 | A | 1/1982 | Chu | |
| 5,139,430 | A | 8/1992 | Lewis | |
| 5,163,219 | A * | 11/1992 | Akulow | H01R 43/26 |
| | | | | 361/785 |
| 5,265,328 | A * | 11/1993 | Gorman | H05K 7/1415 |
| | | | | 29/829 |

(Continued)

FOREIGN PATENT DOCUMENTS

WO 9853654 A1 11/1998

OTHER PUBLICATIONS

Villien, P., "Card-Edge Connector Reliability." Published Jan. 1984. 6 pages. In ElectroComponent Science and Technology. 11. 10.1155/ APEC.11.159.

*Primary Examiner* — Allen L Parker
*Assistant Examiner* — Martin Antonio Asmat Uceda
(74) *Attorney, Agent, or Firm* — Scott Dobson

(57) ABSTRACT

According to one embodiment of the present disclosure, a circuit board includes a substrate including a slot, electronic components connected to the substrate, a board connector connected to the substrate and communicatively connected to the electronic components, and an installation tool including a lug and a pedestal. The pedestal is positioned through the slot and the lug is positioned in the slot to slidably connect the installation tool to the substrate, and the installation tool extends beyond an end of the substrate.

16 Claims, 14 Drawing Sheets

(56)                 References Cited

U.S. PATENT DOCUMENTS

| | | | | | |
|---|---|---|---|---|---|
| 5,367,761 | A * | 11/1994 | Kabat | H05K 7/1415 | 29/758 |
| 5,383,793 | A * | 1/1995 | Hsu | H05K 7/1405 | 361/801 |
| 5,676,561 | A * | 10/1997 | Chiang | H05K 7/1409 | 439/157 |
| 5,822,197 | A * | 10/1998 | Thuault | H05K 7/1452 | 361/740 |
| 6,056,567 | A * | 5/2000 | Schell | H01R 12/7005 | 439/160 |
| 6,129,572 | A | 10/2000 | Feldman | | |
| 6,411,517 | B1 * | 6/2002 | Babin | H05K 7/1461 | 361/759 |
| 6,582,241 | B1 | 6/2003 | Lutz, Jr. | | |
| 6,763,569 | B2 * | 7/2004 | Greenstein | H05K 5/026 | 29/469 |
| 7,396,244 | B1 * | 7/2008 | Barna | H05K 7/1409 | 439/159 |
| 7,410,375 | B2 | 8/2008 | Van Der Steen | | |
| 7,420,816 | B2 * | 9/2008 | Rubenstein | H05K 7/1461 | 361/759 |
| 7,466,561 | B2 * | 12/2008 | Dean | H05K 7/1409 | 361/801 |
| 7,575,451 | B1 * | 8/2009 | Jaramillo | H01R 12/7005 | 439/157 |
| 7,581,959 | B2 * | 9/2009 | Christensen | H05K 7/1409 | 439/259 |
| 7,663,889 | B2 * | 2/2010 | Lajara | G06F 1/185 | 361/759 |
| 7,684,210 | B2 * | 3/2010 | Kosugi | H05K 7/1409 | 361/801 |
| 7,909,627 | B2 | 3/2011 | Hill | | |
| 7,955,112 | B2 * | 6/2011 | Yang | H05K 1/18 | 439/328 |
| 8,215,682 | B2 * | 7/2012 | Hsu | G06F 1/183 | 312/223.1 |
| 8,366,464 | B1 * | 2/2013 | Figuerado | G06F 1/185 | 439/160 |
| 8,665,608 | B2 * | 3/2014 | Hayashi | H05K 7/1409 | 361/728 |
| 8,760,044 | B2 | 6/2014 | Ma | | |
| 9,461,382 | B2 * | 10/2016 | Zhu | G06F 1/185 | |
| 9,583,877 | B1 | 2/2017 | Angelucci | | |
| 9,635,795 | B2 * | 4/2017 | Casserly | G06F 1/185 | |
| 9,872,406 | B2 | 1/2018 | Boetzer | | |
| 11,039,545 | B2 * | 6/2021 | Wang | G11B 33/124 | |
| 11,675,399 | B1 * | 6/2023 | Lee | G06F 1/186 | 361/679.43 |
| 11,683,905 | B1 * | 6/2023 | An | H05K 7/1409 | 361/679.02 |
| 11,683,921 | B2 * | 6/2023 | Tsorng | H05K 7/1402 | 29/758 |
| 2008/0123274 | A1 * | 5/2008 | Desrosiers | H05K 7/1402 | 361/741 |
| 2013/0228538 | A1 | 9/2013 | Engelvin | | |
| 2022/0374057 | A1 * | 11/2022 | Lu | H05K 7/1487 | |

* cited by examiner

100

A

VIEW I

VIEW II

112

COMPUTER HARDWARE INSTALLATION AND REMOVAL TOOL

BACKGROUND

The present disclosure relates to computing systems, and more specifically, to installation features for circuit boards.

Many computing systems, such as servers, include mother boards with connectors that other circuit boards can be plugged in to. These circuit boards can add additional capacity and/or capability to a server, increasing its performance. However, there is often a limited amount of space in a server housing, and the circuit boards themselves can be rather small. This can make it difficult for a user to install the circuit boards by hand. Furthermore, in case a circuit board needs to be removed, doing so can be troublesome using only their fingers.

SUMMARY

According to one embodiment of the present disclosure, a circuit board includes a substrate including a slot, electronic components connected to the substrate, a board connector connected to the substrate and communicatively connected to the electronic components, and an installation tool including a lug and a pedestal. The pedestal is positioned through the slot and the lug is positioned in the slot to slidably connect the installation tool to the substrate, and the installation tool extends beyond an end of the substrate.

According to one embodiment of the present disclosure, a computing system includes a server comprising a card connector and a circuit board connected to the card connector. The circuit board includes an installation tool slidably connected to the circuit board in a sliding direction that is parallel to a connecting direction that the card connector connects to and disconnects from the board connector. The installation tool is movable between an insertion position and an extraction position, and the installation tool is configured to solely contact the circuit board when the installation tool is moved between the insertion position and the extraction position.

According to one embodiment of the present disclosure, a circuit board includes a substrate including a slot and a detent feature, electronic components connected to the substrate, a board connector connected to the substrate and communicatively connected to the electronic components, and an installation tool including a pedestal and a detent. The pedestal is positioned through the slot to slidably connect the installation tool to the substrate, the installation tool is movable between an insertion position and an extraction position, the detent engages the detent feature when the installation tool is in the insertion position, and the installation tool extends beyond an end of the substrate.

DETAILED DESCRIPTION

Figure 1:
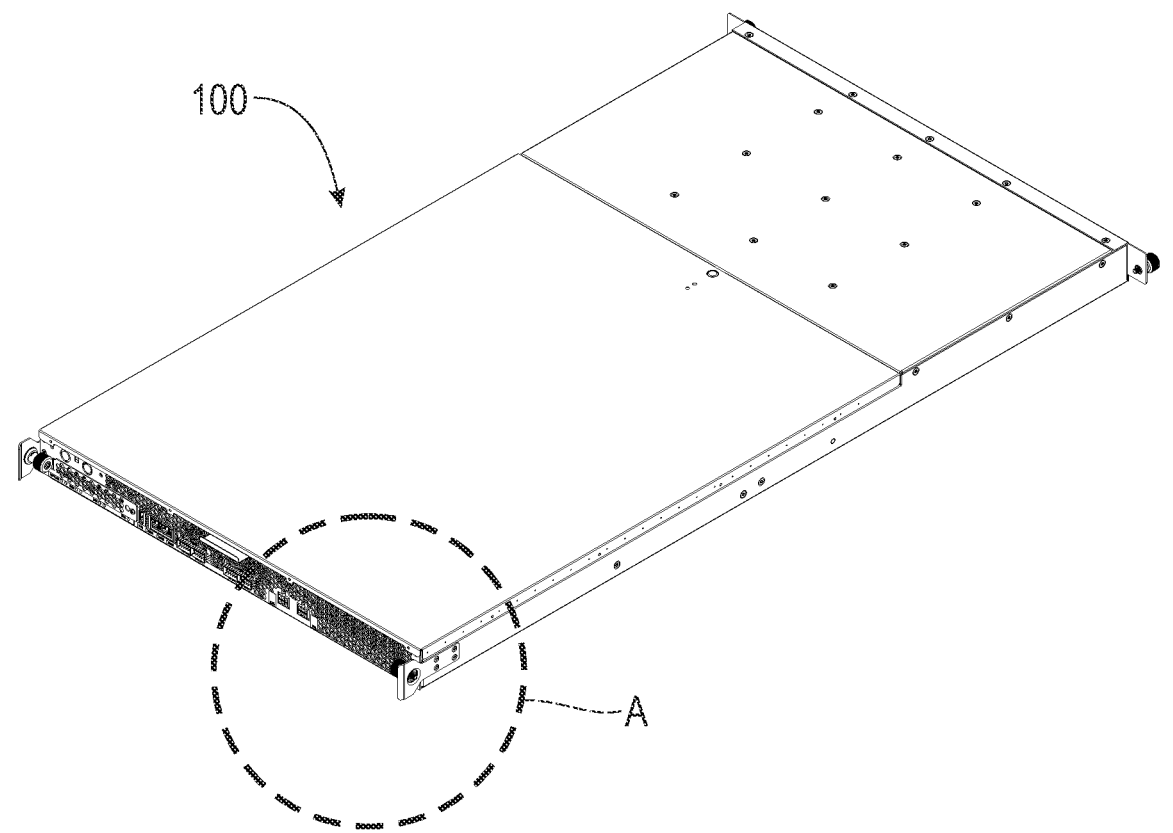
FIG. 1 is a perspective view of a server, in accordance with an embodiment of the present disclosure.
Figure 2:
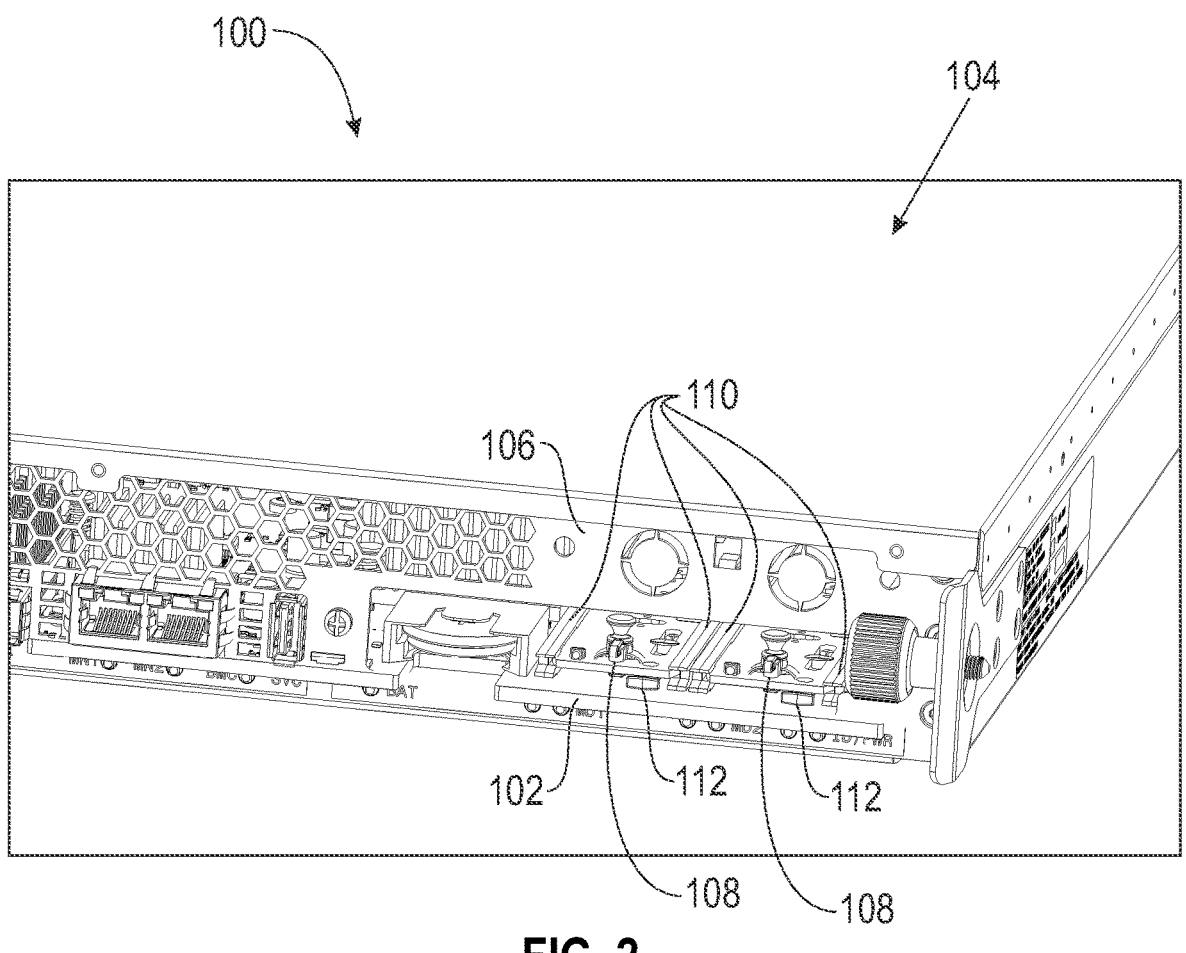
FIG. 2 is a close-up perspective view of the server as indicated by circle A in FIG. 1, in accordance with an embodiment of the present disclosure.

FIG. 1 is a perspective view of server 100. FIG. 2 is a close-up perspective view of server 100 as indicated by circle A in FIG. 1. FIGS. 1 and 2 will now be discussed in conjunction with one another.

In the illustrated embodiment, server 100 is a computing system that comprises motherboard 102 that is connected to housing 104. Housing 104 includes backplate 106 at the back end of server 100. Cards 108 can be, for example, circuit boards of an M.2 configuration that are plugged into motherboard 102 and are supported by rails 110, respectively. Cards 108 are positioned within housing 104, and cards 108 do not extend beyond motherboard 102 or backplate 106. Each card 108 also includes installation and removal tool 112 (hereinafter "tool 112").

Figure 3:
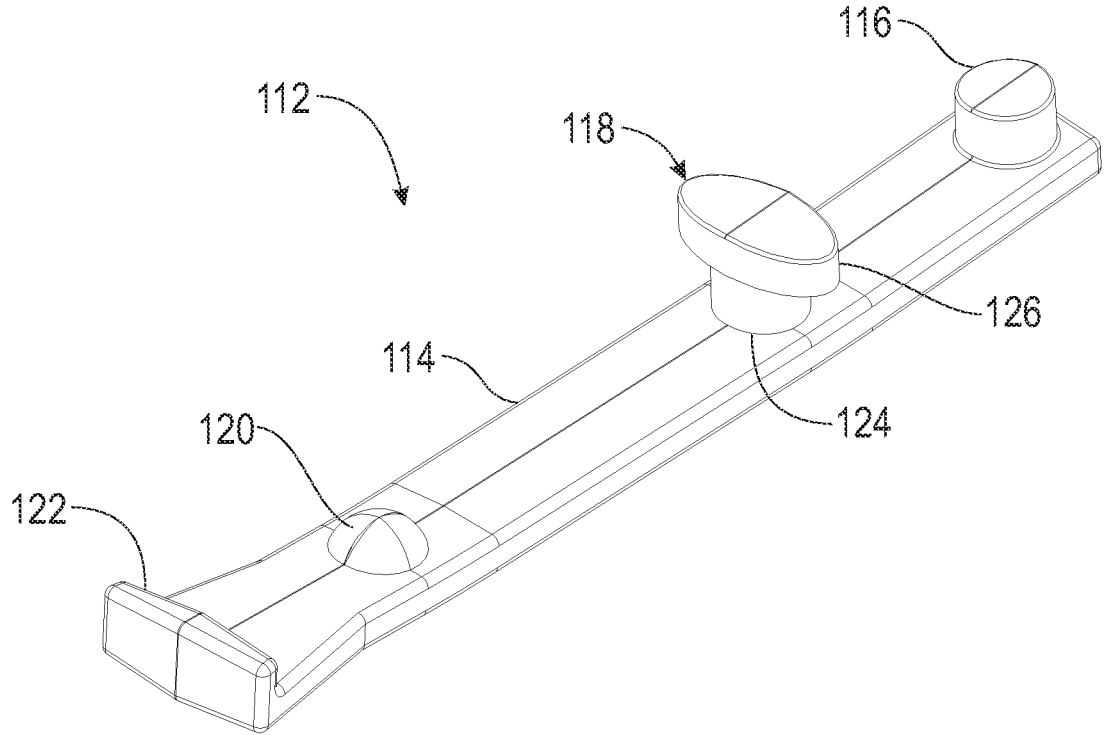
FIG. 3 is a perspective view of an installation and removal tool, in accordance with an embodiment of the present disclosure.

FIG. 3 is a perspective view of tool 112 that is drawn to scale. In the illustrated embodiment, tool 112 is made (e.g., molded or 3D printed) from a flexible material such as, for example, a polymer (e.g., polycarbonate and acrylonitrile butadiene styrene (PC-ABS)).

In the illustrated embodiment, tool 112 comprises bar 114, lug 116, pedestal 118, detent 120, and tab 122. Bar 114 has a rectangular cross section, and lug 116, pedestal 118, detent 120, and tab 122 extend from the same side of bar 114. Tab 122 is located at the rearward end of bar 114 and is configured for a user to grasp, and lug 116 is located near the forward end of bar 114. Pedestal 118 and detent 120 are located between lug 116 and tab 122, and pedestal 118 is closer to lug 116 than detent 120 is. Pedestal 118 includes shaft 124 and head 126, the latter of which has an elliptical shape, for example.

Figure 4:
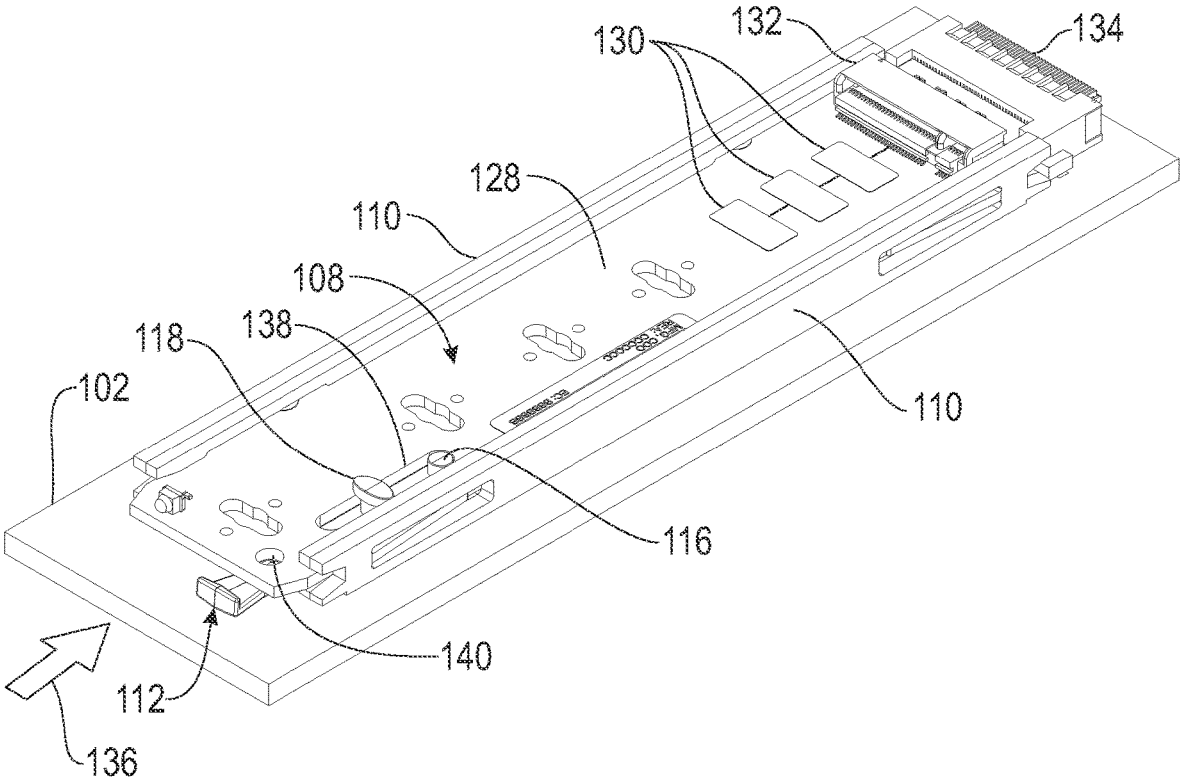
FIG. 4 is a perspective view of a card with the tool in an insertion position, in accordance with an embodiment of the present disclosure.

FIG. 4 is a perspective view of card 108 with the tool 112 in an insertion position. In the illustrated embodiment, motherboard 102 includes rails 110 and card connector 134. Card 108 comprises substrate 128, electronic components 130, and board connector 132. Electronic components 130 and board connector 132 are mounted on substrate 128, and electronic components 130 are electrically connected to board connector 132. Board connector 132 is connected to card connector 134 when card 108 has been plugged into motherboard 102 by a user (not shown) exerting force on tool 112 in direction 136 (i.e., the connecting direction).

In the illustrated embodiment, substrate 128 includes slot 138 and hole 140. Tool 112 is slidably connected to card 108 by pedestal 118 extending through substrate 128 via slot 138. Slot 138 is also configured to receive lug 116 (which is also positioned in slot 138), and lug 116 contacts the forward end of slot 138 when tool 112 is pushed in direction 136. Thus, tool 112 is in the insertion position as shown in FIG. 4, and in the insertion position, detent 120 (shown in FIG. 3) extends into the void formed by hole 140.

Figure 5:
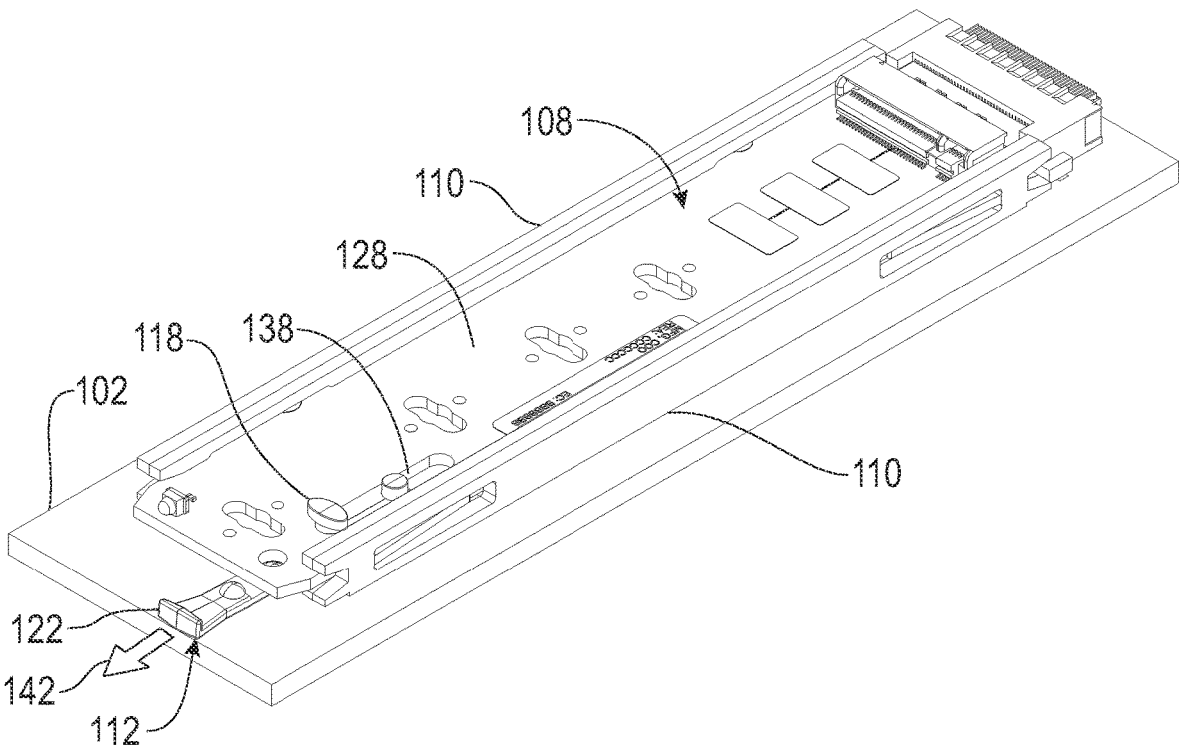
FIG. 5 is a perspective view of the card with the tool in an extraction position, in accordance with an embodiment of the present disclosure.

FIG. 5 is a perspective view of card 108 with tool 112 in an extraction position. While card 108 is still plugged into motherboard 102, a relatively small force can be exerted on tab 122 by a user in direction 142 (i.e., the sliding direction) to move tool 112 from the insertion position to the extraction position. In the extraction position, pedestal 118 contacts the rearward end of slot 138. While tool 112 extends beyond card 108 (i.e., past the rearward end of substrate 128) when in the insertion position, tool 112 further extends beyond motherboard 102 (and possibly beyond backplate 106, shown in FIG. 2) when in the extraction position.

Figure 6:
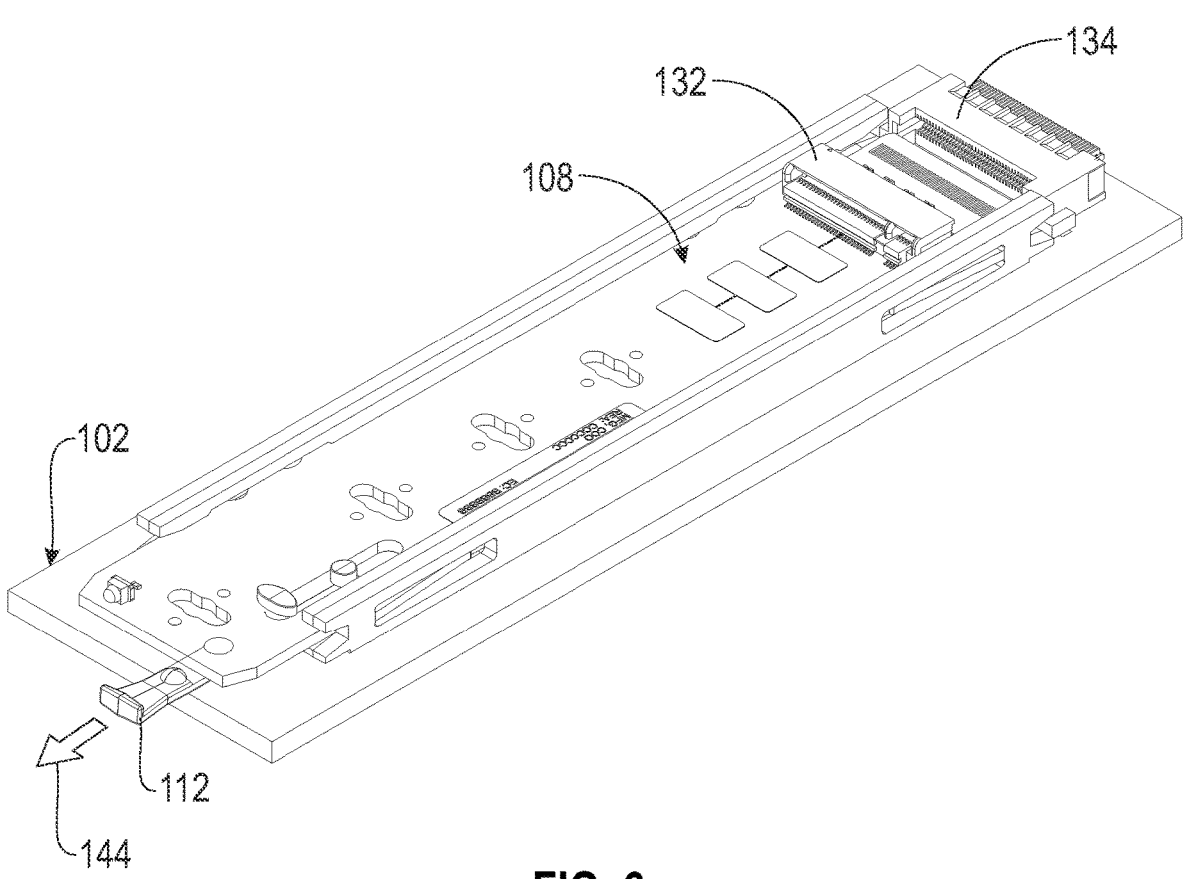
FIG. 6 is a perspective view of the card being disconnected from a motherboard, in accordance with an embodiment of the present disclosure.

FIG. 6 is a perspective view of card 108 being disconnected from motherboard 102. After tool 112 is moved to the extraction position, the user can exert a larger force on tool 112 in direction 144 to disconnect board connector 132 from card connector 134.

Figure 7:
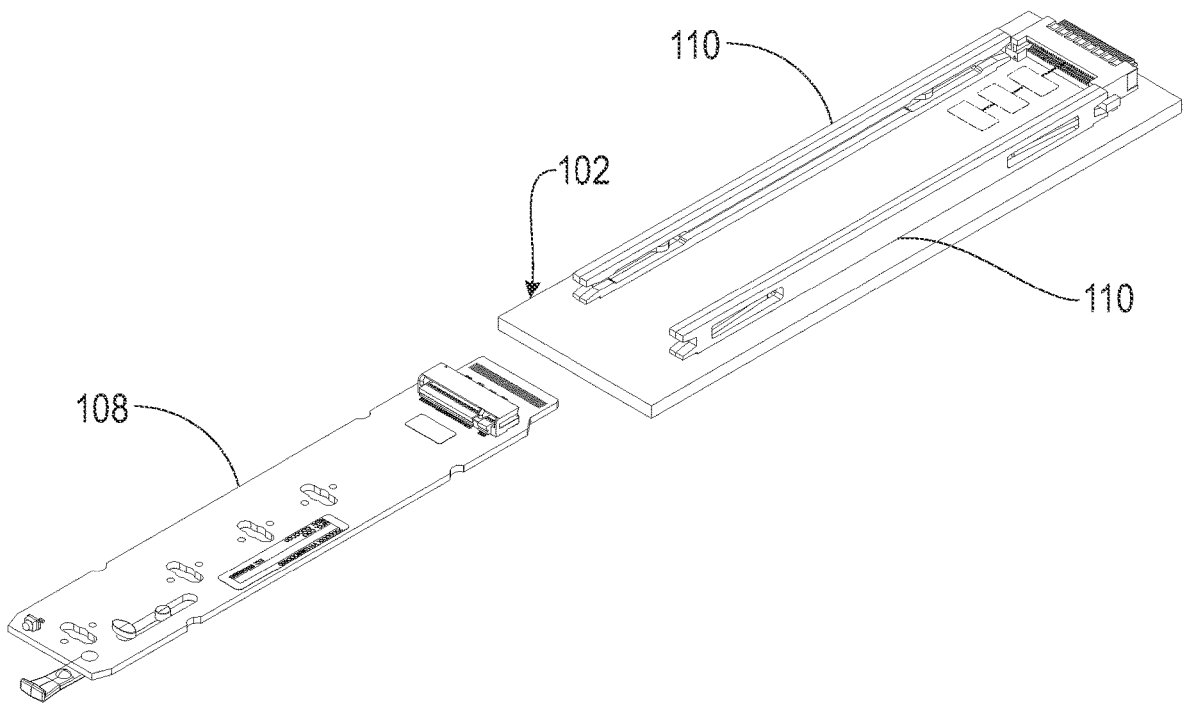
FIG. 7 is a perspective view of the card being removed from the server, in accordance with an embodiment of the present disclosure.

FIG. 7 is a perspective view of card 108 being removed from server 100 (shown in FIG. 1). Once card 108 is disconnected from motherboard 102, card 108 can be slid rearward along rails 110 and then removed from server 100.

Figure 8:
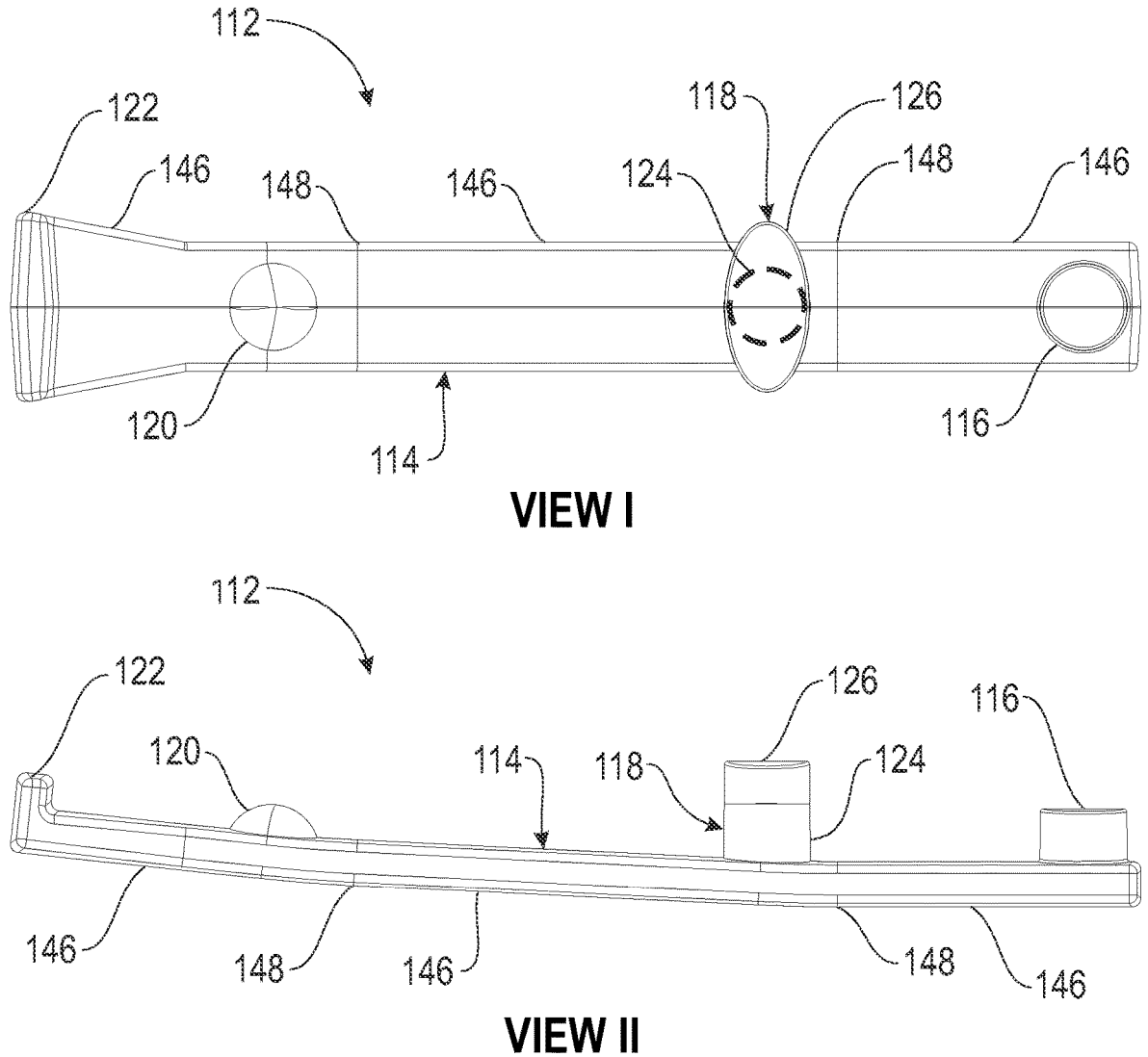
FIG. 8 shows a top view and a side view of the tool, in accordance with an embodiment of the present disclosure.
Figure 9:
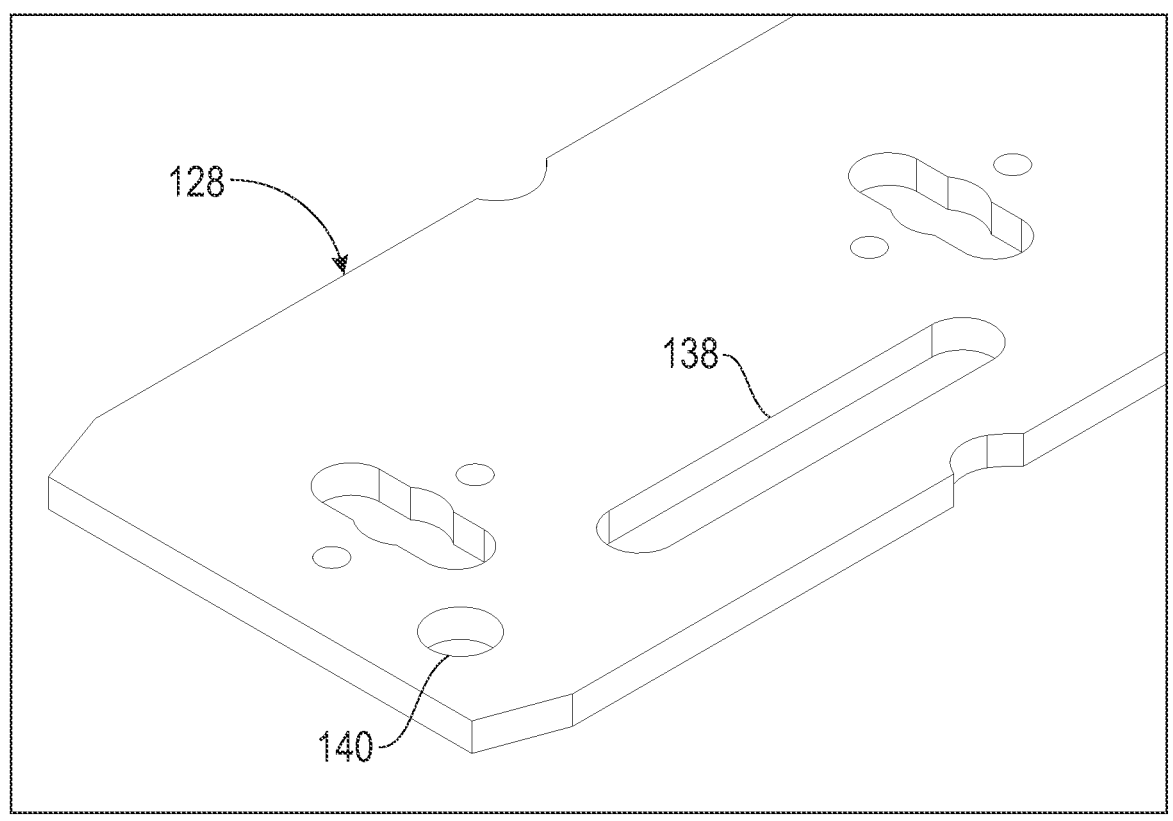
FIG. 9 is a close-up perspective view of a circuit board substrate, in accordance with an embodiment of the present disclosure.

FIG. 8, View I is a top view of tool 112, and FIG. 8, View II is a side view of tool 112. FIG. 9 is a close-up perspective view of substrate 128. FIGS. 8 and 9 are drawn to scale, and they will now be discussed in conjunction with one another.

In the illustrated embodiment, bar 114 is wider than slot 138, and the curvature of bar 114 is comprised of three straight segments 146 with two bends 148 in between, respectively. Each bend 148 can be between 170 and 179 degrees, or between 172 and 176 degrees, although in other embodiments, there are no straight segments 146 and bar 114 is a continuous bend 148. Because each bend 148 is on the same side of bar 114, tool 112 is generally concave towards the side that lug 116 and pedestal 118 are on. However, bends 148 are rather slight to reduce stress on tool 112 (e.g., on bar 114 and head 126) during installation. Pedestal 118 rises from the middle straight segment 146 so that the end of bar 114 proximate lug 116 and detent 120 (and/or the end of bar 114 proximate detent 120) contact the bottom side of substrate 128 (shown in FIG. 5). Pedestal 118 can be between 1.5 millimeters (mm) and 2.0 mm tall to provide sufficient strength to head 126 without contacting any components of server 100 (shown in FIG. 1) above card 108. The width of the narrower axis of head 126 (e.g., the minor axis if head 126 is elliptically shaped) is narrower than slot 138 to allow for installation and can be the same width as the diameter of shaft 124 for strength. Lug 116 can also have the same radius as shaft 124, and these radii can be slightly narrower (e.g., by up to 10%) than the radii of the forward and rearward ends of slot 138. Thereby, the amount of play of lug 116 and shaft 124 in slot 138 is reduced, and the contact areas between lug 116 and substrate 128 and between shaft 124 and substrate 128 is increased.

In the illustrated embodiment, the width of the wider axis of head 126 (e.g., the major axis if head 126 is elliptically shaped) is substantially wider than slot 138 (e.g., between 1.5 and 2.5 times wider, or about twice as wide). When tool 112 is installed on card 108 (shown in FIG. 7, extending alongside substrate 128), the underside of head 126 contacts the top of substrate 128, and the top of the forward and rearward straight segments 146 contact the underside of substrate 128. This configuration stresses tool 112 to be straighter than tool 112 is naturally on its own (i.e., uninstalled, at rest). This is because the thickness of substrate 128 is larger than the vertical distance between the bottom of head 126 and the top of the highest points of bar 114 and/or the top of the edge of contact between detent 120 and hole 140. This results in a spring force that urges detent 120 into hole 140, which prevents tool 112 from moving once card 108 is installed in server 100 (shown in FIG. 1).

In the illustrated embodiment, the thickness of substrate 128 can be between 1.4 mm and 1.8 mm or about 1.6 mm. The thickness of bar 114 can be within 20% of the thickness of substrate 128 as to not add too much thickness to card 108. Hole 140 can be approximately the same diameter as detent 120, although hole 140 can be smaller than detent 120 as to prevent unintended movement in direction 142 (shown in FIG. 5.) While hole 140 is configured to receive detent 120 when tool 112 is in the insertion position, tool 112 will flex downward when moved to the extraction position so that detent 120 can disengage from hole 140. However, this movement is accommodated by gap between the underside of substrate 128 and the top of motherboard 102 (shown in FIG. 7) so that tool 112 solely contacts substrate 128 and does not contact motherboard 102.

Figure 10:
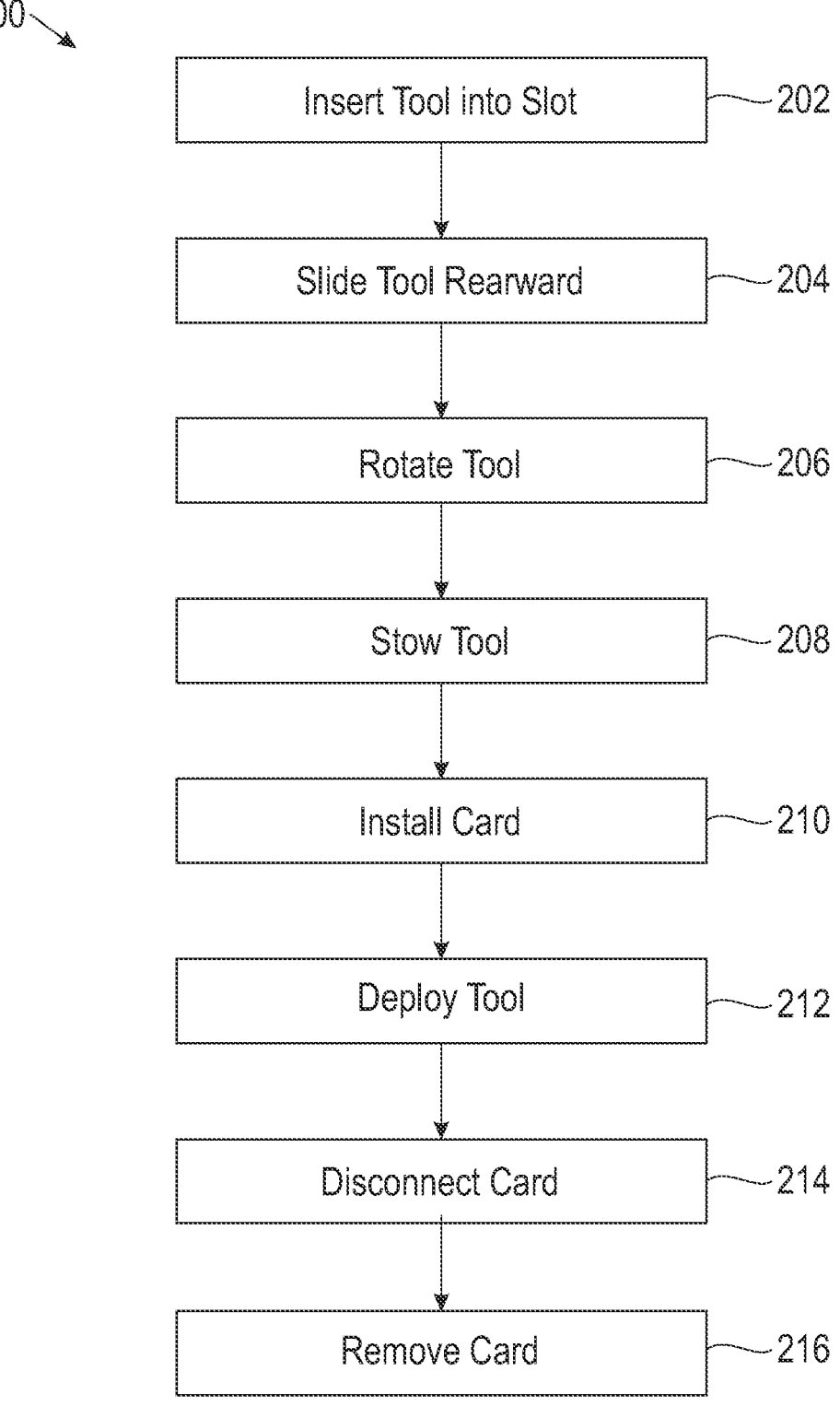
FIG. 10 is a flowchart of a method of using the tool, in accordance with an embodiment of the present disclosure.

FIG. 10 is a flowchart of method 200 of using tool 112. FIGS. 11A-11D are a series of perspective views of some of method 200 of FIG. 10 of using tool 112. FIGS. 10 and 11A-11D will now be discussed in conjunction with one another and with FIGS. 4-7.

Figure 11A:
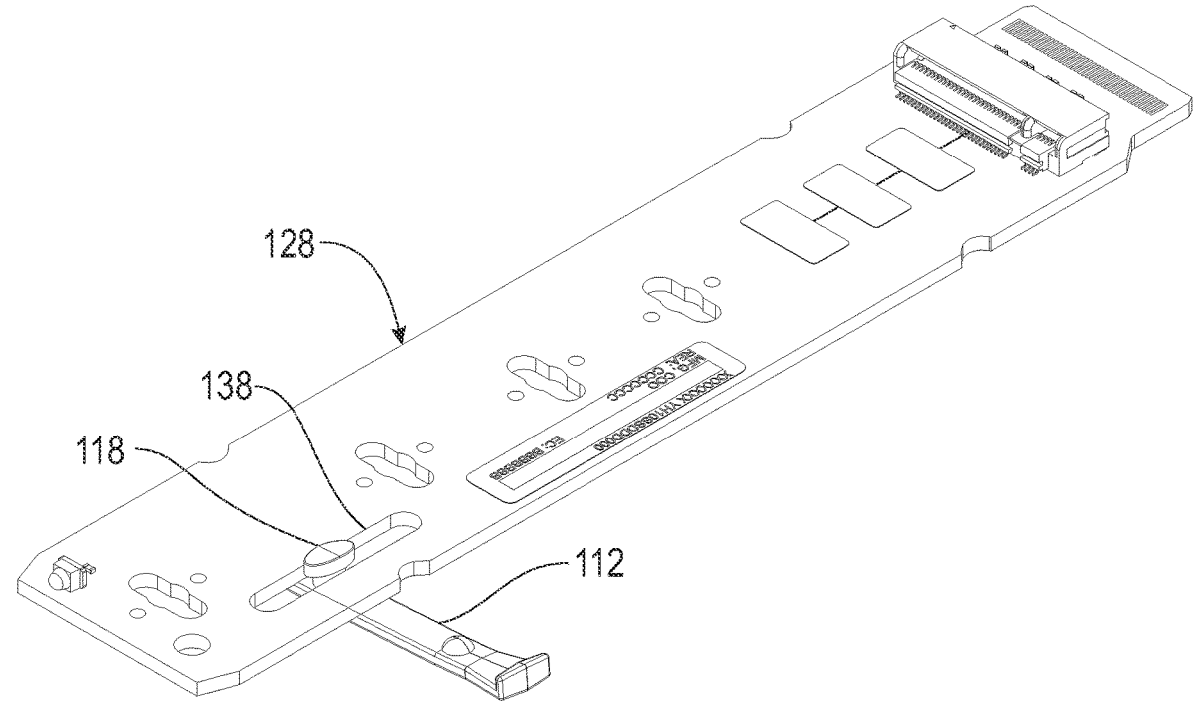
FIGS. 11A-11D are a series of perspective views of some of the method of FIG. 10 of installing the tool, in accordance with an embodiment of the present disclosure.
Figure 11B:
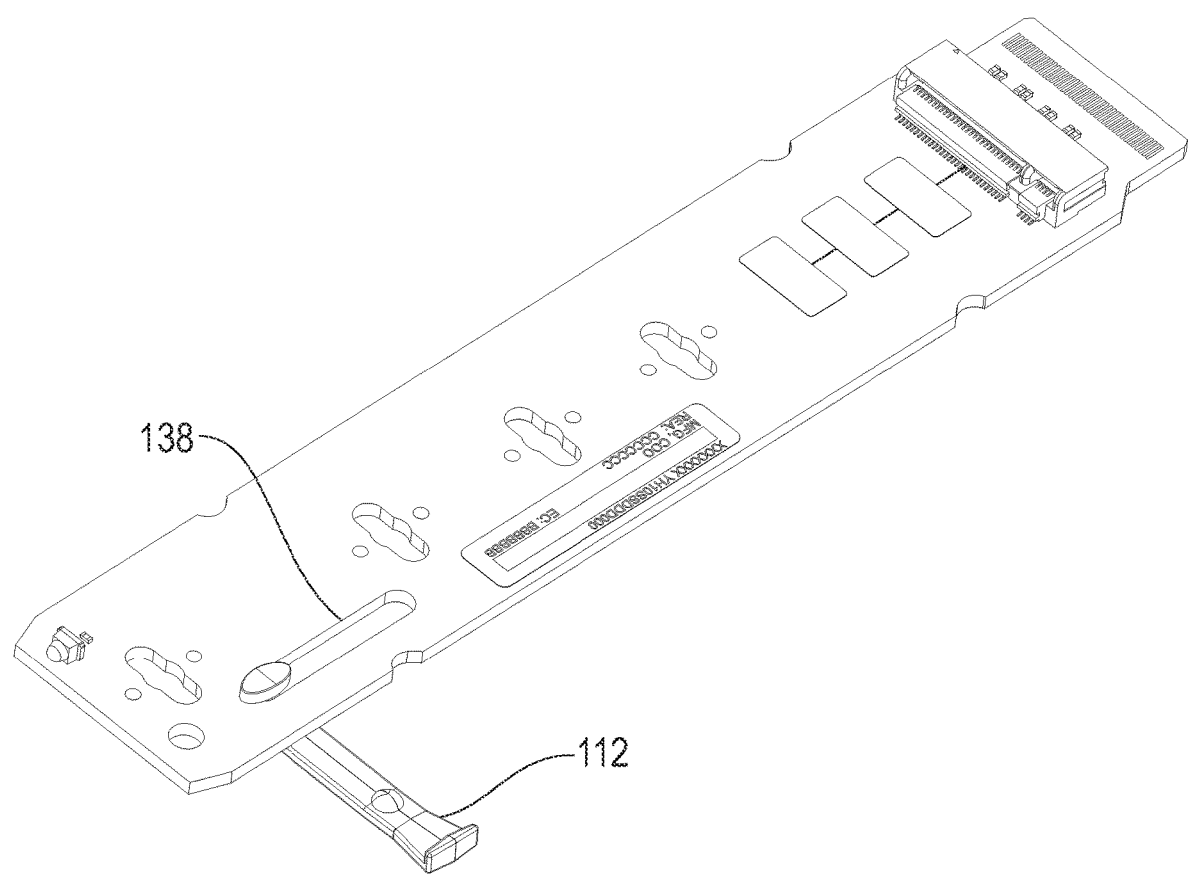
Figure 11C:
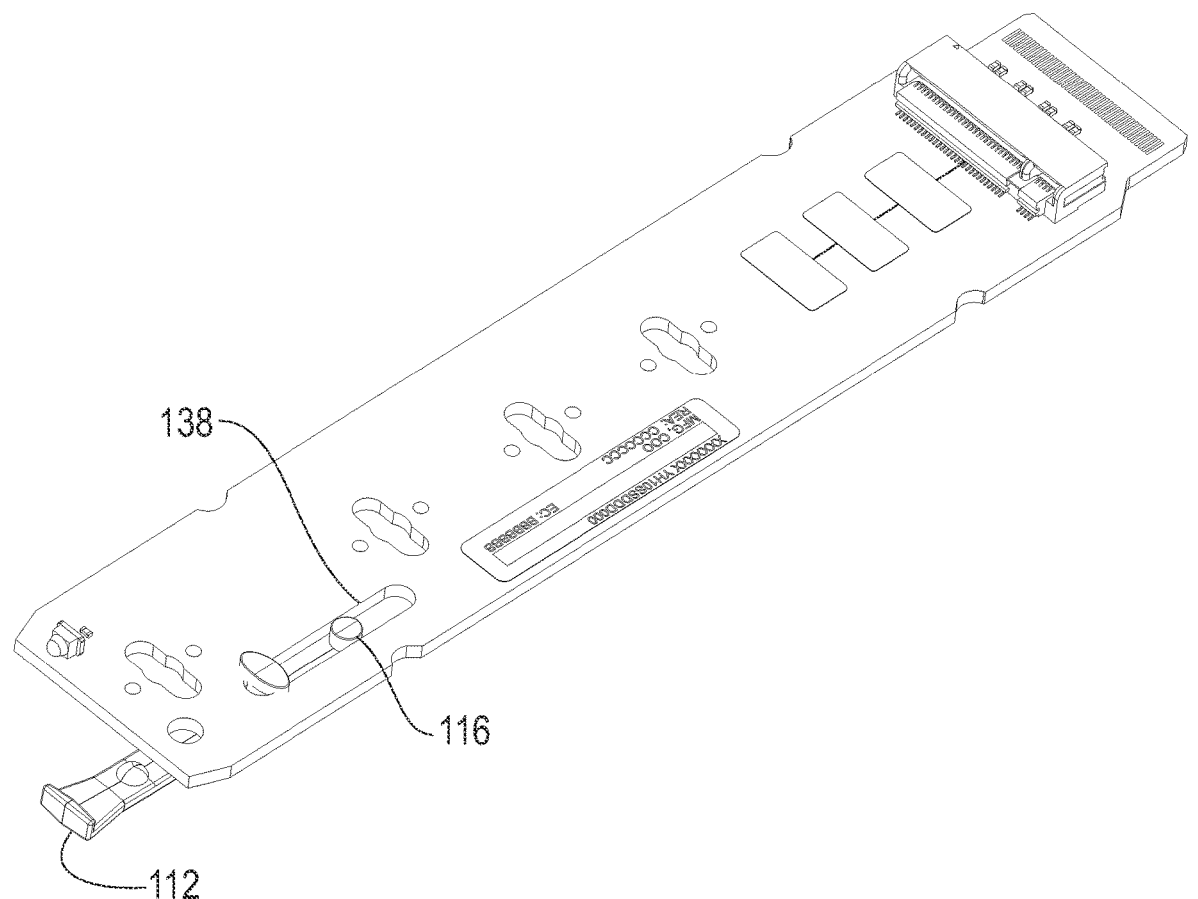
Figure 11D:
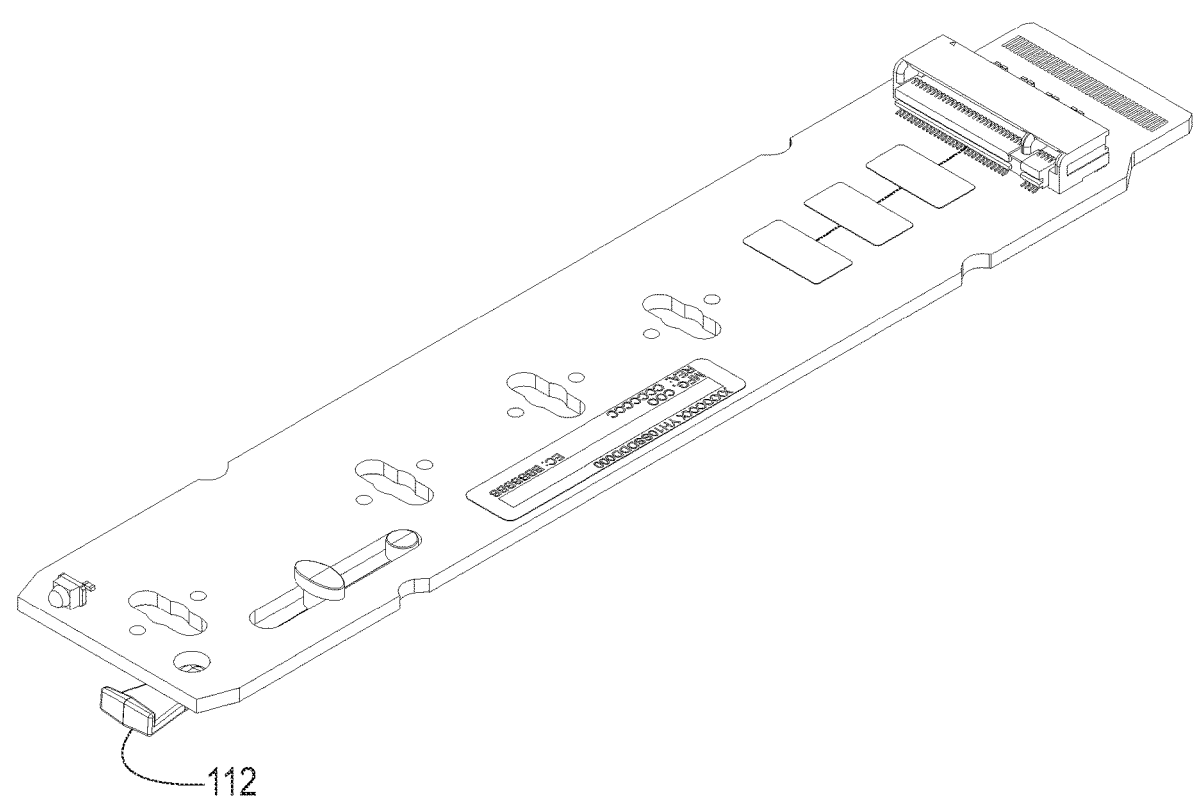

Method 200 begins at operation 202, at which tool 112 is moved alongside substrate 128, and pedestal 118 is passed through slot 138 (shown in FIG. 11A). At operation 204, tool 112 is slid to the rear of slot 128 (shown in FIG. 11B), and at operation 206, tool 112 is rotated 90 degrees to be aligned with slot 138 (shown in FIG. 11C). During operations 202, 204, and/or 206, tool 112 may be substantially flexed to accommodate the height of lug 116 until lug 116 is inserted into slot 138 at the end of operation 206. This flexing can make tool 112 less concave than it is at rest, perhaps to the extent that tool 112 becomes convex. Once pressure is released at the end of operation 206, tool 112 is in the extraction position, wherein tool 112 can be flexed to be less concave than at rest but more concave than during, for example, the middle of operation 206 (i.e., before lug 116 is inserted into slot 138). Then, at operation 208, tool 112 is stowed by moving tool 112 forward into the insertion position (shown in FIG. 11D). This can cause tool 112 to flex again and be less concave than it is at rest but more concave than it is in the extraction position, for example.

At operation 210, card 108 is inserted into server 100 and connected to motherboard 102 (shown in FIG. 4). If desired, at operation 212, tool 112 is deployed by moving tool 112 rearward into the extraction position (shown in FIG. 5). Operation 212 includes flexing tool 112 to remove detent 120 from hole 140. At operation 214, card 108 is disconnected from motherboard 102 (shown in FIG. 6), and at operation 216, card 108 is removed from server 100 (shown in FIG. 7).

As can be seen and as was discussed in the present disclosure, tool 112 occupies only a small area of card 108, which increases the amount of space available for electronic components 130. In addition, the cost of tool 112 is only incurred for every card 108, which saves cost compared to having an installation and/or removal tool connected to server 100 and/or motherboard 102 for each card slot. This is because such a tool would need to be made and installed regardless of whether the port was used or not.

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computing system comprising:
a server comprising a card connector; and
a circuit board connected to the card connector, the circuit board comprising a substrate, a board connector connected to the substrate, and an installation tool slidably connected to the circuit board in a sliding direction that is parallel to a connecting direction that the card connector connects to and disconnects from the board connector,
wherein:
the installation tool is movable between an insertion position and an extraction position, the installation tool is configured to solely contact the circuit board when the installation tool is moved between the insertion position and the extraction position,
the installation tool comprises:
a bar,
a pedestal extending from a side of the bar,
a lug extending from the side of the bar, and
a detent extending from the side of the bar, and
the circuit board comprises:
a slot configured to receive the pedestal and the lug; and
a detent feature configured to receive the detent.
2. The computing system of claim 1, wherein;
the installation tool extends beyond an end of the substrate.
3. The computing system of claim 2, wherein the server further comprises a motherboard to which the card connector is connected, wherein the installation tool does not extend beyond a side of the motherboard.
4. The computing system of claim 1, wherein:
the lug contacts a first end of the slot when the installation tool is in the insertion position; and
the pedestal contacts a second end of the slot when the installation tool is in the extraction position.
5. The computing system of claim 1, wherein
the installation tool extends alongside the substrate.
6. The computing system of claim 1, wherein:
the installation tool further comprises a tab extending from the side of the bar;
the tab is configured for a user to grasp; and
the pedestal is positioned between the tab and the lug.
7. The computing system of claim 1, wherein the bar is curved such that the side of the bar is concave.
8. The computing system of claim 1, wherein the installation tool extends alongside the substrate.
9. The computing system of claim 1, wherein:
the pedestal includes a shaft and a head; and
the head is wider than a width of the slot in a first direction and narrower than the width of the slot in a second direction that is different than the first direction.
10. A circuit board comprising:
a substrate;
a board connector connected to the substrate; and
an installation tool slidably connected to the circuit board in a sliding direction that is parallel to a connecting direction that a card connector connects to and disconnects from the board connector,
wherein:
the installation tool is movable between an insertion position and an extraction position,
the installation tool is configured to solely contact the circuit board when the installation tool is moved between the insertion position and the extraction position,
the installation tool comprises:
a bar,
a pedestal extending from a side of the bar,
a lug extending from the side of the bar, and
a detent extending from the side of the bar, and
the circuit board comprises:
a slot configured to receive the pedestal and the lug; and
a detent feature configured to receive the detent.
11. The circuit board of claim 10, wherein:
the lug contacts a first end of the slot when the installation tool is in the insertion position; and the pedestal contacts a second end of the slot when the installation tool is in the extraction position.

12. The circuit board of claim 10, wherein the installation tool extends alongside the substrate.

13. The circuit board of claim 10, wherein:

the installation tool further comprises a tab extending from the side of the bar;

the tab is configured for a user to grasp; and the pedestal is positioned between the tab and the lug.

14. The circuit board of claim 10, wherein the bar is curved such that the side of the bar is concave.

15. The circuit board of claim 10, wherein the installation tool extends alongside the substrate.

16. The circuit board of claim 10, wherein:

the pedestal includes a shaft and a head; and the head is wider than a width of the slot in a first direction and narrower than the width of the slot in a second direction that is different than the first direction.

\* \* \* \* \*